United States Patent
Xie et al.

(10) Patent No.: US 9,196,696 B2
(45) Date of Patent: Nov. 24, 2015

(54) INTEGRATED CIRCUITS WITH IMPROVED GATE UNIFORMITY AND METHODS FOR FABRICATING SAME

(71) Applicants: GLOBALFOUNDRIES Inc., Grand Cayman (KY); International Business Machines Corporation, Armonk, NY (US)

(72) Inventors: Ruilong Xie, Niskayuna, NY (US); Xiuyu Cai, Albany, NY (US); Kangguo Cheng, Schenectady, NY (US); Ali Khakifirooz, Los Altos, CA (US)

(73) Assignees: GLOBALFOUNDRIES, INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/260,913

(22) Filed: Apr. 24, 2014

(65) Prior Publication Data
US 2014/0231920 A1    Aug. 21, 2014

Related U.S. Application Data

(62) Division of application No. 13/618,035, filed on Sep. 14, 2012, now Pat. No. 8,748,309.

(51) Int. Cl.
*H01L 23/48* (2006.01)
*H01L 29/49* (2006.01)
*H01L 21/28* (2006.01)
*H01L 29/66* (2006.01)
*H01L 21/3213* (2006.01)

(52) U.S. Cl.
CPC ...... *H01L 29/4958* (2013.01); *H01L 21/28088* (2013.01); *H01L 21/32134* (2013.01); *H01L 21/32135* (2013.01); *H01L 29/4966* (2013.01); *H01L 29/66545* (2013.01)

(58) Field of Classification Search
USPC .................................. 257/751, 750
See application file for complete search history.

(56) References Cited

U.S. PATENT DOCUMENTS

| | | | |
|---|---|---|---|
| 6,476,454 B2 * | 11/2002 | Suguro | 257/410 |
| 6,884,673 B2 * | 4/2005 | Joo et al. | 438/240 |
| 2005/0070109 A1 * | 3/2005 | Feller et al. | 438/692 |
| 2006/0240665 A1 * | 10/2006 | Kang et al. | 438/653 |
| 2011/0079828 A1 * | 4/2011 | Anderson et al. | 257/288 |
| 2012/0187563 A1 * | 7/2012 | Hsieh et al. | 257/751 |
| 2012/0319179 A1 * | 12/2012 | Huang et al. | 257/288 |
| 2012/0326238 A1 * | 12/2012 | Chien et al. | 257/369 |

* cited by examiner

*Primary Examiner* — Reema Patel
(74) *Attorney, Agent, or Firm* — Ingrassia Fisher & Lorenz, P.C.

(57) ABSTRACT

Integrated circuits with improved gate uniformity and methods for fabricating such integrated circuits are provided. In an embodiment, an integrated circuit includes a semiconductor substrate and a replacement metal gate structure overlying the semiconductor substrate. The replacement metal gate structure includes a first metal and a second metal and has a recess surface formed by the first metal and the second metal. The first metal and the second metal include a first species of diffused foreign ions. The integrated circuit further includes a metal fill material overlying the recess surface formed by the first metal and the second metal.

20 Claims, 5 Drawing Sheets

INTEGRATED CIRCUITS WITH IMPROVED GATE UNIFORMITY AND METHODS FOR FABRICATING SAME

CROSS-REFERENCE TO RELATED APPLICATIONS

This is a divisional of U.S. application Ser. No. 13/618,035, filed Sep. 14, 2012.

TECHNICAL FIELD

The present disclosure generally relates to integrated circuits and methods for fabricating integrated circuits, and more particularly relates to integrated circuits having replacement metal gates with improved uniformity and methods for fabricating integrated circuits having replacement metal gates with improved uniformity.

BACKGROUND

Semiconductor devices are continuously improved to enhance device performance. As devices are being scaled down, the technology becomes more complex, and changes in device structures and new fabrication methods are needed to maintain the expected performance enhancement from one generation of devices to the next. For example, when gate to gate pitch is extremely scaled, the conventional source/drain contact formation leads to a significant issue with gate-to-source/drain shorts. It has been found that borderless contact formation prevents the gate from connecting to the source/drain and enables a greater process window.

To realize borderless contacts in replacement metal gate integration schemes, a dielectric cap may be used to isolate the gate from the source/drain contact. Typically, the process of forming the dielectric cap involves recessing work function metals in the gate, depositing a low resistivity metal fill material, and recessing the fill material before depositing the capping material. Uniformity in the thicknesses of the work function metals and the metal fill provide for uniform gate resistivity and improved performance. Therefore, improved recessing processes providing for uniform layer thicknesses would improve device performance.

Accordingly, it is desirable to provide integrated circuits with improved gate uniformity and methods for fabricating integrated circuits with improved gate uniformity. Also, it is desirable to provide integrated circuits and methods for fabricating integrated circuits which utilize recessing processes with improved control. Other desirable features and characteristics will become apparent from the subsequent detailed description and the appended claims, taken in conjunction with the accompanying drawings and the foregoing technical field and background.

BRIEF SUMMARY

Integrated circuits with improved gate uniformity and methods for fabricating such integrated circuits are provided. In accordance with one embodiment, a method for fabricating an integrated circuit includes providing a structure including a first region and a second region. A structure surface is formed by the first region and the second region. The first region is formed by a first material and the second region is formed by a second material. In the method, the structure surface is exposed to a gas cluster ion beam (GCIB) and an irradiated layer is formed in the structure in both the first region and the second region. The irradiated layer is then etched to form a recess.

In another embodiment, a method for fabricating an integrated circuit includes providing a replacement metal gate with a gate surface formed by a first metal and a second metal having different etch rates. A layer is formed in the replacement metal gate adjacent the gate surface with a substantially uniform etch rate. The layer is then selectively etched to form a recess in the replacement metal gate with a uniform depth.

In accordance with another embodiment, an integrated circuit includes a semiconductor substrate and a replacement metal gate structure positioned on the semiconductor substrate. The replacement metal gate structure includes a first metal and a second metal. Further, the replacement metal gate structure has a recess surface formed in the first metal and the second metal. Each of the first metal and the second metal includes a first species of diffused foreign ion. The integrated circuit includes a metal fill material formed over the first metal and the second metal at the recess surface.

BRIEF DESCRIPTION OF THE DRAWINGS

Embodiments of integrated circuits with improved gate uniformity and methods for fabricating integrated circuits with improved gate uniformity will hereinafter be described in conjunction with the following drawing figures, wherein like numerals denote like elements, and wherein.

DETAILED DESCRIPTION

Figure 1:
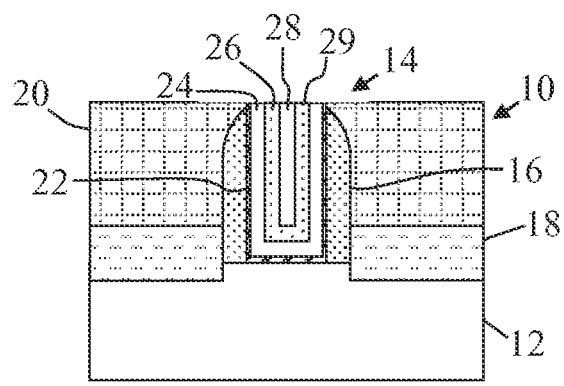
FIGS. 1-10 illustrate, in cross section, a portion of an integrated circuit and method steps for fabricating an integrated circuit in accordance with various embodiments herein.

The following Detailed Description is merely exemplary in nature and is not intended to limit the integrated circuits or methods for fabricating integrated circuits as claimed herein. Furthermore, there is no intention to be bound by any expressed or implied theory presented in the preceding Technical Field, Background, Brief Summary, or the following Detailed Description. As may appear herein, the term "over" is utilized to indicate relative position between two structural elements and not necessarily to denote physical contact between structural elements. Certain terminology may appear in the following Detailed Description for the purpose of reference only and is not intended to be limiting. For example, terms such as "over" and other terms referring to directions in the subsequently-referenced Drawings. These and similar terms may be utilized herein to describe the orientation and/or location of a feature or element within a consistent but arbitrary frame of reference, which is made clear by reference to the text and the associated Drawings describing the component, device, and/or process under discussion.

In accordance with the various embodiments herein, integrated circuits with improved gate uniformity and methods for fabricating integrated circuits with improved gate uniformity are provided. As disclosed herein, problems with conventionally-formed replacement metal gates may be reduced. Specifically, conventional techniques can result in replacement metal gate layers having non-uniform thicknesses, such as within a replacement metal gate or across a plurality of replacement metal gates. Non-uniform layer thicknesses result in varying gate resistivity.

A conventional process may form a gate structure with vertically-aligned layers of two or more different work function metals. Typical processing requires recessing these different metals and depositing a metal fill material over them. However, the metals typically have different etch rates. Because a non-landing etch process is required, it is difficult to etch the different metals to a same depth—leading to varying etch depths and replacement metal gate layers having varying thicknesses.

In order to provide improved uniformity during recessing of the replacement metal gate layers, the integrated circuit and method for fabricating integrated circuits disclosed herein provide for forming a layer that is selectively etchable or that has a substantially uniform etch rate in the replacement metal gate. Specifically, foreign ions are implanted through the surface of the replacement metal gate and into the metal layers. As a result, an implanted layer is formed across the different metal layers. In some embodiments, the implanted layer may have a substantially uniform etch rate (for at least one etchant) or may be selectively etchable. Thereafter, the implanted layer is etched to a uniform depth across the different metal layers. As a result, replacement metal gates are formed with layers having greater thickness uniformity.

FIGS. 1-10 illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

In FIG. 1, in an exemplary embodiment, the process of fabricating an integrated circuit 10 begins by providing a semiconductor substrate 12. A gate structure 14 is formed on the semiconductor substrate 12 between two spacers 16 according to well-known lithographic steps. Further, source/drain regions 18 are formed in or on the semiconductor substrate 12. An insulator or interlayer dielectric material 20 is deposited over the source/drain regions 18 and planarized at the same height as the spacers.

The exemplary gate structure 14 in FIG. 1 is a replacement metal gate. It includes a high-k dielectric liner 22. A first material layer 24 is formed directly on the high-k dielectric liner 22. The first material layer 24 may be, for example, a metal such as TiN. A second material layer 26 is formed directly on the first material layer 24. The second material layer 26 may be, for example, a metal such as TaC or TiC. As shown, an optional third material layer 28 is formed directly on the second material layer 26, if there is still space left inside the gate. The third material layer 28 may be, for example, TiN. Typically, the layers 22, 24, 26, 28 are planarized to a surface 29 as shown in FIG. 1. While three layers 24, 26, 28 are illustrated, it is contemplated that the gate structure 14 include two or more layers. The layers 22, 24, 26, 28 may have two, three or four different etch rates for a given etchant.

In an exemplary embodiment, the first, second and third material layers 24, 26, 28 are work function metals. Work function is a material property, measured in electron volts (eV), which represents the amount of energy needed to remove an electron from a solid to a point outside the solid surface or the energy needed to move an electron from the Fermi level into a vacuum. In practice, the work function value is the amount of energy needed to move the metal electron from the metal to the high-k material. For a metal, the work function is a constant, and for a semiconductor material, the work function can be modified by the addition of other materials, such as boron or phosphorus, generally considered dopant materials. A transistor's threshold voltage may be modified when using materials having different desired work functions in a metal gate structure.

A work function material as detailed herein is a material having work function material properties and used to form the desired properties, such as electrical properties, of a gate structure. The work function material may be disposed on or adjacent to the high k dielectric material to provide the most effect of the work function material's properties on the metal gate electrode structure of a transistor. The work function required will depend on the high-k material and the doping type and amount of the source, drain, and channel. Thus, the composition of the work function metal is often varied to achieve the desired threshold voltage. The work function of N-metal planar gate structures should typically be equal to or less than 4.3 eV, whereas the work function for non-planar gate structures such as FinFET gate structures, where higher doping is acceptable, may be equal to or less than 4.4 eV.

The work function materials are metals and may include metal carbide, metal silicide, metal carbide silicide, metal carbide nitride, or metal boride material, among other materials. The work function material may be deposited, for example, to a thickness of about 20 Å or more, such as from about 20 Å to about 80 Å, for example, about 30 Å thick.

Figure 2:
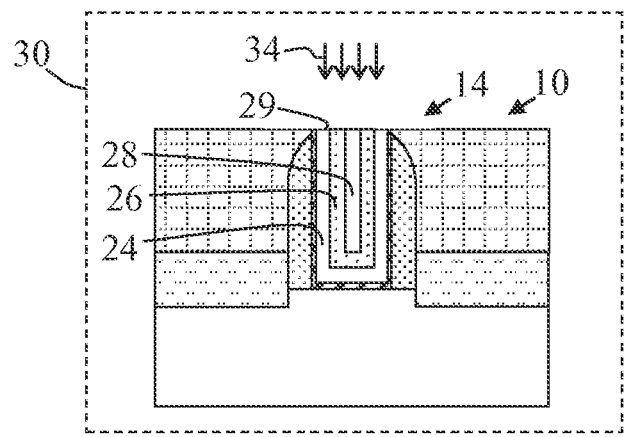
Figure 3:
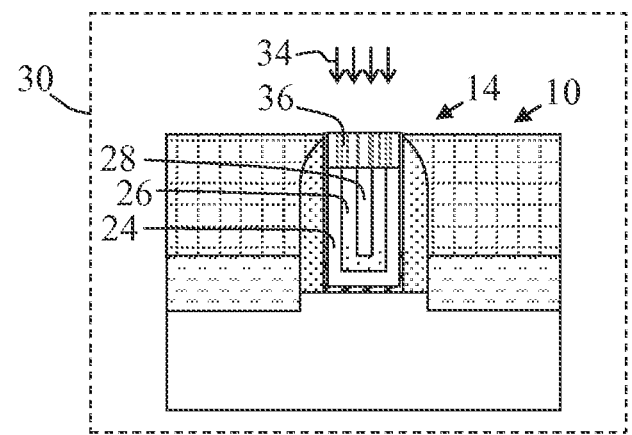

In FIG. 2, the partially fabricated integrated circuit 10 is positioned in a processing chamber 30 for processing. As shown, a gas cluster ion beam (GCIB) 34 is directed at the surface 29 of the replacement metal gate structure 14. As shown in FIG. 3, ions from the GCIB 34 are implanted in the gate structure 14 to a uniform depth across the layers 24, 26, 28 and form an irradiated or implanted layer 36 in the gate structure 14. While the ions may be any foreign ions, in an exemplary embodiment in which the layers 24 and 28 are TiN and layer 26 is TaC, oxygen ions are implanted into the gate structure 14. In such an embodiment the implanted layer 36 is formed by $TiO_2$ (in the formerly TiN layers) and $Ta_2O_5$ (in the formerly TaC layer). The foreign ions are selected so that the etch rate of the implanted layer 36 is substantially the same across the layers 24, 26, 28 for a selected etchant. In other words, the formation of the implanted layer 36 provides for a substantially uniform etch rate across layers 24, 26, 28 which may previously have had different etch rates.

With the partially fabricated integrated circuit 10 remaining in the processing chamber 30, the layer 36 is etched as shown in FIG. 3. The etching process may be a dry etch or wet etch. In an exemplary embodiment in which the implanted layer 36 is formed from $TiO_2$ and $Ta_2O_5$, the etch process may be performed with $SF_6$/Ar or $Cl_2$/Ar based chemistry. The exemplary etchant will etch the respective materials at substantially the same etch rate and will be selective toward the implanted layer 36. Further, the etch process can be performed until only a limited amount of oxygen remains in the gate structure 14. Specifically, the oxygen content in the gate structure 14 can be monitored as the etching process is performed by monitoring the oxygen trace signal in the etch plasma chamber. When the oxygen content reaches a selected level, the etching process can be stopped. As a result, the gate structure may retain a trace amount of the foreign ions diffused into the layers 24, 26, 28.

In an exemplary embodiment in which the layers 24 and 28 are TiN, layer 26 is TiC, and oxygen ions have been implanted, the implanted layer 36 is formed of $TiO_2$. The $TiO_2$ implanted layer 36 can be selectively etched from TiN and TiC by a known wet etch process.

Figure 4:
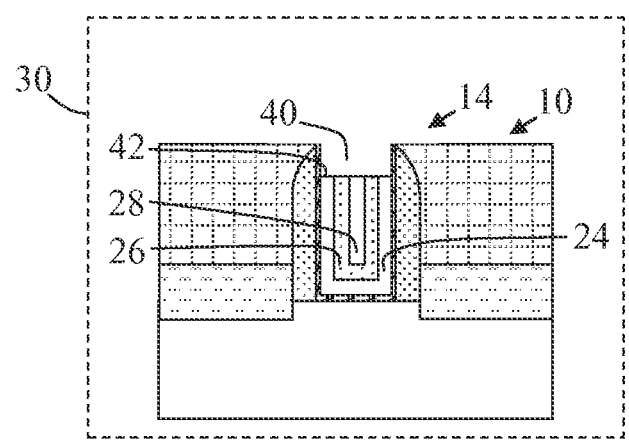
Figure 5:
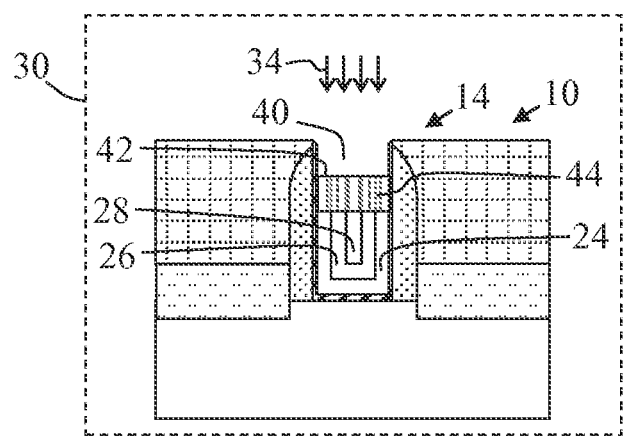
Figure 6:
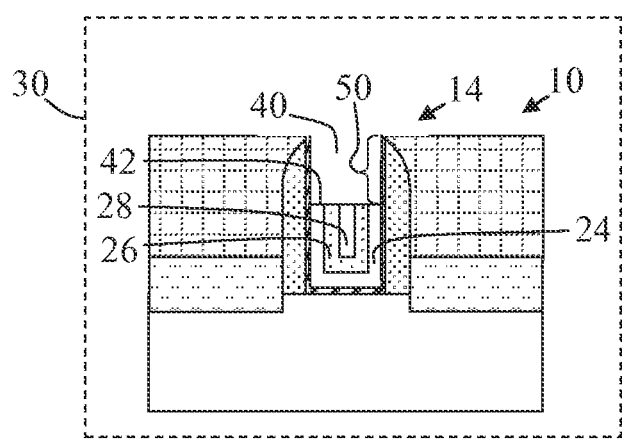

FIG. 4 illustrates the partially fabricated integrated circuit 10 after layer 36 has been etched to form a recess 40 in the gate structure 14. As shown, the recess 40 forms a recess surface 42. While it is contemplated that the initial formation and etch of layer 36 may provide a recess 40 of a desired depth, in an exemplary embodiment, the steps of FIGS. 3 and 4 are repeated in FIGS. 5 and 6. Specifically, in FIG. 5, a GCIB 34 is directed at the recess surface 42 to implant ions into the gate structure 14 to form an implanted layer 44. In FIG. 6, the implanted layer 44 is etched in the same manner as the etch process of FIG. 4. As a result, the recess 40 is deepened and has a uniform depth 50. While the desired uniform depth 50 was obtained in FIG. 6 through two implanted layer formation and etch processes, it is contemplated that any practical number of implanted layer formation and etch processes can be performed, including a single implanted layer formation and etch.

Figure 7:
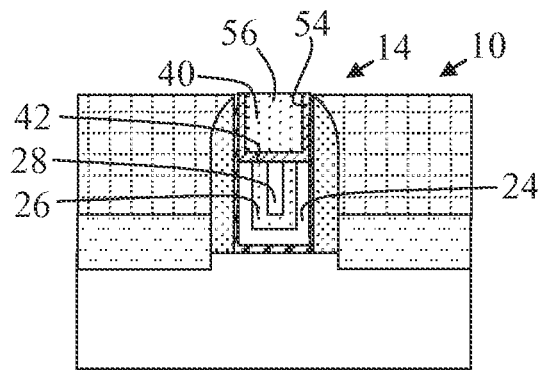

In FIG. 7, a liner 54 and a fill material 56 are deposited over the recess surface 42. The liner 54 is typically a thin metal film such as TiN, Ru, or TaN which functions to keep the fill material from diffusing into the sidewall spacers and surrounding insulator. The fill material 56 is typically a low-resistivity metal film and it completes the replacement metal gate structure 14. Examples of a metal for use as a fill material include materials from the group of tungsten, aluminum, copper, cobalt, and combinations thereof, and alloys of tungsten, aluminum, copper, cobalt and combinations thereof. The fill material 56 should have an equal or lesser resistivity than the work function material layers.

Figure 8:
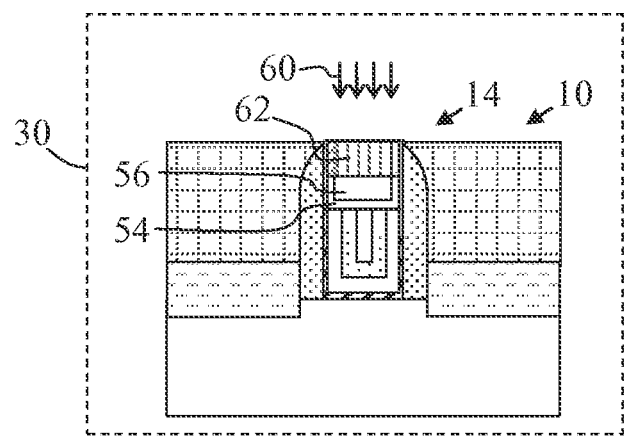
Figure 9:
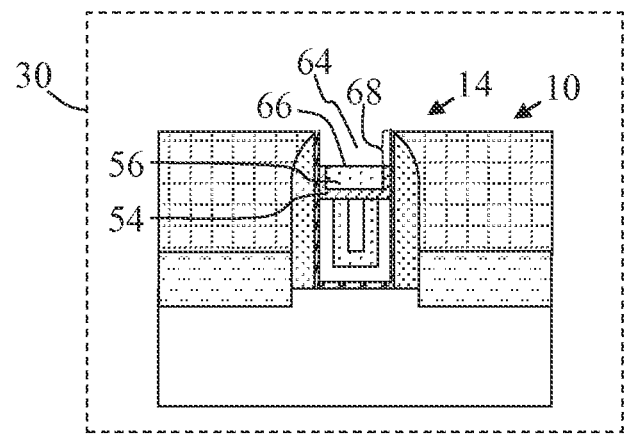

As shown in FIG. 8, the partially fabricated integrated circuit 10 may be further processed in processing chamber 30 using a GCIB 60. In this case, the GCIB 60 may implant foreign ions into the liner 54 and fill material 56 to form an implanted layer 62. For a TiN liner 54 and W fill material 56, the GCIB 60 may implant nitrogen ions. After the implanted layer 62 is formed with the desired depth, it is etched in the processing chamber 30 as shown in FIG. 9. The etch process can be done by two steps: the first step is etching WNx selectively to W, and the second step is etching the exposed TiN above the top W surface selectively to W. As a result, a recess 64 is formed and defines a recess surface 66. The recess 64 has a uniform depth 68 that is controlled by forming an implanted region of uniform depth that is selectively etchable in contrast to the unimplanted material, or by etching the implanted region at a substantially uniform etch rate. As with the etching of implanted layer 36, the process of forming and etching an implanted layer 62 may be repeated to achieve a desired depth 68.

Figure 10:
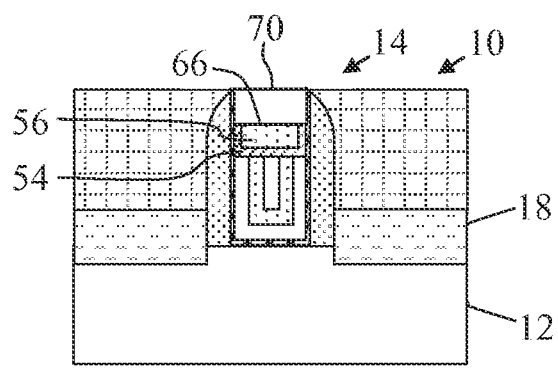

In FIG. 10, a dielectric capping layer 70 is deposited over the recess surface 66 to isolate the gate structure 14. Thereafter, additional processing may be performed including borderless source/drain contact formation. As a result of the processing described above, the integrated circuit 10 may be formed with a replacement metal gate structure 14 positioned on the semiconductor substrate 12 and including a first metal layer 24 and a second metal layer 26. Further, a first species of foreign ions, such as oxygen, is diffused in the first metal layer 24 and second metal layer 26. A recess surface 42 is formed in the first metal layer 24 and the second metal layer 26. Also, a liner 54 and a metal fill material 56 are formed on the first metal layer 24 and the second metal layer 26, and a second species of foreign ions, such as nitrogen, may be diffused in the liner 54 and metal fill material 56. Typically, the first and second species of foreign atoms are present in the finished IC in trace amounts or in amounts less than a selected baseline for etching.

As described above, an integrated circuit is fabricated with improved gate uniformity. Conventional processes result in replacement metal gates having irregular or non-uniform layer thicknesses and corresponding increases in gate resistance variation. These issues are avoided by incorporating the controlled implantation of foreign ions into metal gate layers to form implanted layers that may be selectively etched and/or that may be etched at a substantially uniform rate. As a result, the thicknesses of the work function metals are uniform within a gate structure. Further, the thickness of the work function metals and the thickness of the metal fill are uniform across of plurality of gate structures. Therefore, variation in gate resistance is minimized.

To briefly summarize, the integrated circuits and fabrication methods described herein result in improved metal gate uniformity. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit comprising:
   a semiconductor substrate;
   a replacement metal gate structure overlying the semiconductor substrate, the replacement metal gate structure including:
      a gate structure liner;
      a first work function material overlying the gate structure liner, wherein the first work function material is titanium nitride; and
      a second work function material overlying the gate structure liner, wherein the second work function material is titanium carbide, wherein a recess surface is formed by the first work function material and the second work function material, and wherein the first work function material and the second work function material include a first species of diffused foreign ions, wherein the first species of diffused foreign ions is oxygen; and
   a metal fill material overlying the recess surface formed by the first work function material and the second work function material.

2. The integrated circuit of claim 1 wherein the metal fill material includes a second species of diffused foreign ions.

3. The integrated circuit of claim 2 wherein the second species of diffused foreign ions is nitrogen.

4. The integrated circuit of claim 1 wherein the gate structure liner is a high-k dielectric material and further comprising an anti-diffusion liner overlying the recess surface formed by the first work function material and the second work function material and underlying the metal fill material.

5. The integrated circuit of claim 4 wherein the anti-diffusion liner and the metal fill material define an upper surface, and wherein the upper surface is established by implanting a second species of foreign ions into the metal fill material and the anti-diffusion liner to form a second implanted layer, and by selectively etching the second implanted layer to form a trench bounded by the upper surface.

6. The integrated circuit of claim 5 further comprising a dielectric cap on the upper surface.

7. The integrated circuit of claim 1 wherein the replacement metal gate structure includes a third work function material, wherein the recess surface is formed by the first work function material metal, the second work function material, and the third work function material, and wherein the first work function material, the second work function material, and the third work function material include the first species of diffused foreign ions.

8. The integrated circuit of claim 1 wherein the recess surface extends from a first gate edge to a second gate edge, and wherein the first species of diffused foreign ions extends from the first gate edge to the second gate edge.

9. The integrated circuit of claim 1 wherein the first work function material and the second work function material form a work function layer with a uniform thickness from the gate structure liner to the recess surface.

10. The integrated circuit of claim 1 wherein the recess surface is parallel to the semiconductor substrate.

11. The integrated circuit of claim 1 wherein the first work function material is directly on the gate structure liner and the second work function material is surrounded by the first work function material and separated from the gate structure liner by the first work function material.

12. The integrated circuit of claim 11 further comprising an anti-diffusion liner directly on the recess surface formed by the first work function material and the second work function material and directly on the gate structure liner.

13. The integrated circuit of claim 12 wherein the metal fill material and the anti-diffusion liner include a second species of diffused foreign ions different from the first species of diffused foreign ions.

14. The integrated circuit of claim 1 wherein the first work function material includes two vertically-aligned layers, and wherein the second work function material includes a vertically-aligned layer positioned between the two vertically-aligned layers of the first work function material.

15. An integrated circuit comprising:
a semiconductor substrate;
a replacement metal gate structure overlying the semiconductor substrate, the replacement metal gate structure including:
a gate structure liner, wherein the gate structure liner is a high-k dielectric material;
a first work function material overlying the gate structure liner; and
a second work function material overlying the gate structure liner, wherein a recess surface is formed by the first work function material and the second work function material, and wherein the first work function material and the second work function material include a first species of diffused foreign ions;
a metal fill material overlying the recess surface formed by the first work function material and the second work function material; and
an anti-diffusion liner overlying the recess surface formed by the first work function material and the second work function material and underlying the metal fill material, wherein the metal fill material and the anti-diffusion liner include a second species of diffused foreign ions, wherein the anti-diffusion liner and the metal fill material define an upper surface, and wherein the upper surface is established by implanting the second species of foreign ions into the metal fill material and the anti-diffusion liner to form a second implanted layer, and by selectively etching the second implanted layer to form a trench bounded by the upper surface.

16. The integrated circuit of claim 15 wherein the anti-diffusion liner is titanium nitride, ruthenium, or tantalum nitride, and wherein the metal fill material is tungsten, aluminum, copper, cobalt or combinations thereof.

17. The integrated circuit of claim 15 further comprising a dielectric cap on the upper surface defined by the metal fill material and the anti-diffusion liner.

18. An integrated circuit comprising:
a semiconductor substrate;
a replacement metal gate structure overlying the semiconductor substrate, the replacement metal gate structure including:
a gate structure liner;
a first work function material overlying the gate structure liner;
a second work function material overlying the gate structure liner; and
a third work function material, wherein the recess surface is formed by the first work function material metal, the second work function material, and the third work function material, and wherein the first work function material, the second work function material, and the third work function material include a first species of diffused foreign ions, wherein the first work function material includes two vertically-aligned layers, wherein the second work function material includes two vertically-aligned layers positioned between the two vertically-aligned layers of the first work function material, and wherein the third work function material includes a vertically-aligned layer positioned between the two vertically-aligned layers of the second work function material; and
a metal fill material overlying the recess surface formed by the first work function material, the second work function material and the third work function material.

19. The integrated circuit of claim 18 wherein the first species of diffused foreign ions is oxygen.

20. The integrated circuit of claim 18 wherein the first work function material is titanium nitride, the second work function material is titanium carbide, and the first species of diffused foreign ions is oxygen.

* * * * *